(12) United States Patent
Patrick et al.

(10) Patent No.: US 8,187,413 B2
(45) Date of Patent: May 29, 2012

(54) ELECTRODE ASSEMBLY AND PLASMA PROCESSING CHAMBER UTILIZING THERMALLY CONDUCTIVE GASKET

(75) Inventors: Roger Patrick, Mountain View, CA (US); Raj Dhindsa, San Jose, CA (US); Greg Bettencourt, Fremont, CA (US); Alexei Marakhtanov, Albany, CA (US)

(73) Assignee: Lam Research Corporation, Freemont, CA (US)

( * ) Notice: Subject to any disclaimer, the term of this patent is extended or adjusted under 35 U.S.C. 154(b) by 497 days.

(21) Appl. No.: 12/050,195

(22) Filed: Mar. 18, 2008

(65) Prior Publication Data
US 2009/0236040 A1 Sep. 24, 2009

(51) Int. Cl.
*C23F 1/00* (2006.01)
*H01L 21/306* (2006.01)
*C23C 16/00* (2006.01)

(52) U.S. Cl. .............. 156/345.34; 118/723 R
(58) Field of Classification Search ............ 156/345.34; 118/723 R
See application file for complete search history.

(56) References Cited

U.S. PATENT DOCUMENTS

| | | | |
|---|---|---|---|
| 3,783,173 A * | 1/1974 | Twomey | 174/356 |
| 4,595,484 A | 6/1986 | Giammarco et al. | |
| 4,654,754 A | 3/1987 | Daszkowski | |
| 4,782,893 A | 11/1988 | Thomas | |
| 4,792,378 A | 12/1988 | Rose et al. | |
| 4,820,371 A | 4/1989 | Rose | |
| 4,960,488 A | 10/1990 | Law et al. | |
| 5,518,758 A | 5/1996 | Tiburtius et al. | |
| 5,534,751 A | 7/1996 | Lenz et al. | |
| 5,545,473 A | 8/1996 | Ameen et al. | |
| 5,660,917 A | 8/1997 | Fujimori et al. | |
| 5,679,457 A | 10/1997 | Bergerson | |
| 5,932,007 A | 8/1999 | Li | |
| 6,036,782 A | 3/2000 | Tanaka et al. | |
| 6,050,216 A * | 4/2000 | Szapucki et al. | 118/723 E |
| 6,073,577 A | 6/2000 | Lilleland et al. | |
| 6,096,414 A | 8/2000 | Young | |

(Continued)

FOREIGN PATENT DOCUMENTS

JP 2006324400 A 11/2006

(Continued)

OTHER PUBLICATIONS

U.S. Appl. No. 12/112,112, filed Apr. 30, 2008.

(Continued)

*Primary Examiner* — Keath Chen
(74) *Attorney, Agent, or Firm* — Dinsmore & Shohl LLP

(57) ABSTRACT

The present invention relates generally to plasma processing and, more particularly, to plasma processing chambers and electrode assemblies used therein. According to one embodiment of the present invention, an electrode assembly is provided comprising a thermal control plate, a silicon-based showerhead electrode, and a thermally conductive gasket, wherein respective profiles of a frontside of the thermal control plate and a backside of the showerhead electrode cooperate to define a disjointed thermal interface comprising portions proximal to showerhead passages of the showerhead electrode and portions displaced from the showerhead passages. The displaced portions are recessed relative to the proximal portions and are separated from the showerhead passages by the proximal portions of the thermal interface. The gasket is positioned along the displaced portions such that the gasket is isolated from the showerhead passages and may facilitate heat transfer across the thermal interface from the showerhead electrode to the thermal control plate.

21 Claims, 4 Drawing Sheets

U.S. PATENT DOCUMENTS

| | | | |
|---|---|---|---|
| 6,123,775 | A | 9/2000 | Hao et al. |
| 6,131,646 | A | 10/2000 | Kelley |
| 6,165,612 | A | 12/2000 | Misra |
| 6,170,432 | B1 | 1/2001 | Szapucki et al. |
| 6,200,415 | B1 | 3/2001 | Maraschin |
| 6,220,607 | B1 | 4/2001 | Schneider et al. |
| 6,245,192 | B1 | 6/2001 | Dhindsa et al. |
| 6,331,349 | B1 | 12/2001 | Kalinoski et al. |
| 6,343,647 | B2 | 2/2002 | Kim et al. |
| 6,365,063 | B2 | 4/2002 | Collins et al. |
| 6,376,385 | B2 | 4/2002 | Lilleland et al. |
| 6,379,491 | B1 | 4/2002 | Lee et al. |
| 6,391,787 | B1 | 5/2002 | Dhindsa et al. |
| 6,412,437 | B1 | 7/2002 | Campbell et al. |
| 6,432,831 | B2 | 8/2002 | Dhindsa et al. |
| 6,468,925 | B2 | 10/2002 | Campbell et al. |
| 6,475,933 | B1 | 11/2002 | Brown et al. |
| 6,491,784 | B2 | 12/2002 | Yamaguchi et al. |
| 6,496,373 | B1 | 12/2002 | Chung |
| 6,651,736 | B2 | 11/2003 | Chiu et al. |
| 6,733,015 | B2 | 5/2004 | Forry et al. |
| 6,786,175 | B2 | 9/2004 | Dhindsa et al. |
| 6,818,097 | B2 | 11/2004 | Yamaguchi et al. |
| 6,824,627 | B2 | 11/2004 | Dhindsa et al. |
| 6,855,377 | B2 | 2/2005 | Yajima et al. |
| 6,983,892 | B2 | 1/2006 | Noorbakhsh et al. |
| 6,984,288 | B2 | 1/2006 | Dhindsa et al. |
| 7,017,269 | B2 | 3/2006 | White et al. |
| 7,018,506 | B2 | 3/2006 | Hongoh et al. |
| 7,094,315 | B2 | 8/2006 | Chen et al. |
| 7,137,444 | B2 | 11/2006 | Faybishenko et al. |
| 7,159,537 | B2 | 1/2007 | Wickramanayaka et al. |
| 7,205,050 | B2 | 4/2007 | Haas |
| 7,208,192 | B2 | 4/2007 | Bunyan et al. |
| 7,220,937 | B2 | 5/2007 | Hofman et al. |
| 7,708,859 | B2 | 5/2010 | Huang et al. |
| 7,712,434 | B2 | 5/2010 | Dhindsa et al. |
| 7,732,728 | B2 | 6/2010 | Dhindsa et al. |
| 7,854,820 | B2 | 12/2010 | De La Llera et al. |
| 2001/0033059 | A1 | 10/2001 | Forry et al. |
| 2002/0123230 | A1 | 9/2002 | Hubacek |
| 2003/0106644 | A1 | 6/2003 | Sirkis et al. |
| 2004/0187792 | A1 | 9/2004 | Parks |
| 2005/0028935 | A1 | 2/2005 | Wickramanayaka et al. |
| 2005/0127329 | A1* | 6/2005 | Wang et al. ........ 252/500 |
| 2005/0133160 | A1 | 6/2005 | Kennedy et al. |
| 2005/0145336 | A1 | 7/2005 | Matsushima et al. |
| 2005/0241765 | A1 | 11/2005 | Dhindsa et al. |
| 2005/0241766 | A1 | 11/2005 | Dhindsa et al. |
| 2006/0054280 | A1 | 3/2006 | Jang |
| 2006/0060138 | A1 | 3/2006 | Keller et al. |
| 2006/0137607 | A1 | 6/2006 | Seo et al. |
| 2006/0207502 | A1 | 9/2006 | Dhindsa et al. |
| 2006/0229416 | A1* | 10/2006 | Walker et al. ........ 525/474 |
| 2006/0253942 | A1* | 11/2006 | Barrera et al. ........ 977/852 |
| 2006/0266852 | A1 | 11/2006 | Choi |
| 2007/0066038 | A1 | 3/2007 | Sadjadi et al. |
| 2007/0068629 | A1 | 3/2007 | Shih et al. |
| 2007/0187038 | A1 | 8/2007 | Ren et al. |
| 2008/0081114 | A1 | 4/2008 | Johanson et al. |
| 2008/0090417 | A1 | 4/2008 | De La Llera et al. |
| 2008/0141941 | A1 | 6/2008 | Augustino et al. |
| 2008/0171444 | A1 | 7/2008 | Dhindsa et al. |
| 2008/0242085 | A1 | 10/2008 | Fischer et al. |
| 2008/0255294 | A1* | 10/2008 | Yerushalmi-Rozen ....... 524/495 |
| 2008/0308229 | A1 | 12/2008 | Patrick et al. |
| 2008/0318433 | A1 | 12/2008 | Dhindsa et al. |
| 2009/0066035 | A1* | 3/2009 | Hurlbert et al. ........ 277/592 |
| 2009/0081878 | A1 | 3/2009 | Dhindsa |
| 2009/0095424 | A1 | 4/2009 | Bettencourt et al. |
| 2009/0111276 | A1 | 4/2009 | Dhindsa et al. |
| 2009/0236040 | A1 | 9/2009 | Patrick et al. |
| 2009/0305509 | A1 | 12/2009 | Stevenson et al. |
| 2010/0000683 | A1 | 1/2010 | Kadkhodayan et al. |
| 2010/0003824 | A1 | 1/2010 | Kadkhodayan et al. |
| 2010/0003829 | A1 | 1/2010 | Patrick et al. |
| 2010/0040768 | A1 | 2/2010 | Dhindsa |
| 2010/0124822 | A1 | 5/2010 | Dhindsa et al. |
| 2010/0151687 | A1 | 6/2010 | Dhindsa et al. |
| 2010/0159707 | A1 | 6/2010 | Huang et al. |
| 2010/0184298 | A1 | 7/2010 | Dhindsa |
| 2010/0261354 | A1 | 10/2010 | Bettencourt et al. |
| 2011/0042879 | A1 | 2/2011 | Kellogg et al. |

FOREIGN PATENT DOCUMENTS

| | | |
|---|---|---|
| JP | 2007123796 A | 5/2007 |
| JP | 2008103589 A | 5/2008 |
| KR | 20040007301 A | 1/2004 |
| KR | 20050043829 | 10/2006 |
| KR | 1020070015599 A | 2/2007 |
| WO | 2005065186 A2 | 7/2005 |

OTHER PUBLICATIONS

International Search Report and Written Opinion based on International application No. PCT/US2009/033060 dated Aug. 27, 2009.
Office Action for U.S. Appl. No. 11/871,586 dated Nov. 20, 2009.
US Office Action dated Mar. 26, 2010 pertaining to U.S. Appl. No. 11/871,586.
US Office Action dated Aug. 31, 2010 pertaining to U.S. Appl. No. 12/112,112.
US Advisory Action dated Apr. 20, 2010 pertaining to U.S. Appl. No. 11/871,586.
International Search Report and Written Opinion dated Nov. 28, 2008 pertaining to International application No. PCT/US2008/064488.
Glasgow et al., "Performance Testing of Thermal Interface Filler Materials in a Bolted Aluminum Interface Under Thermal/Vacuum Conditions", National Aeronautics and Space Administration, Jun. 2003.
The Berquist Company, "Thermal Materials: Sil-Pad Products", http://www/berquistcompany.com/tm_sil_pad-print.cfm?98d+104284, Jun. 13, 2007.
International Search Report and Written Opinion dated Jan. 9, 2009 pertaining to International application No. PCT/US2008/075676.
U.S. Appl. No. 11/871,586, filed Oct. 12, 2007.
U.S. Appl. No. 12/409,984, filed Mar. 24, 2009.
US Office Action dated Oct. 20, 2010 pertaining to U.S. Appl. No. 11/871,586.
International Search Report and Written Opinion dated Oct. 6, 2010 pertaining to International application No. PCT/US2010/027273.
Final Office Action dated Aug. 10, 2011 pertaining to U.S. Appl. No. 11/871,586, filed Oct. 12, 2007.
U.S. Final Office Action dated Dec. 21, 2010 pertaining to U.S. Appl. No. 12/112,112.
U.S. Final Office Action dated Feb. 8, 2011 pertaining to U.S. Appl. No. 11/871,586.
Examiner's Interview Summary dated Feb. 2, 2011 pertaining to U.S. Appl. No. 12/112,112.
Office Action mailed Mar. 28, 2011 as it pertains to U.S. Appl. No. 11/871,586.
Office Action mailed Sep. 21, 2011 as it relates to U.S. Appl. No. 12/112,112.
Notice of Allowance dated Dec. 5, 2011 pertaining to U.S. Appl. No. 11/871,586, filed Oct. 12, 2007.
Final Office Action dated Dec. 22, 2011 pertaining to U.S. Appl. No. 12/112,112, filed Apr. 30, 2008.

* cited by examiner

ELECTRODE ASSEMBLY AND PLASMA PROCESSING CHAMBER UTILIZING THERMALLY CONDUCTIVE GASKET

BACKGROUND

The present invention relates generally to plasma processing and, more particularly, to plasma processing chambers and electrode assemblies used therein. Plasma processing apparatuses can be used to process substrates by a variety of techniques including, but not limited to, etching, physical vapor deposition, chemical vapor deposition, ion implantation, resist removal, etc. For example, and not by way of limitation, one type of plasma processing chamber contains an upper electrode, commonly referred to as a showerhead electrode, and a bottom electrode. An electric field is established between the electrodes to excite a process gas into the plasma state to process substrates in the reaction chamber.

BRIEF SUMMARY

According to one embodiment of the present invention, an electrode assembly is provided comprising a thermal control plate, a silicon-based showerhead electrode, and a thermally conductive gasket. The thermal control plate comprises a frontside, a backside, and a plurality of process gas passages, while the showerhead electrode comprises a frontside, a backside, and a plurality of showerhead passages. The thermal control plate and the showerhead electrode are engaged such that the frontside of the thermal control plate faces the backside of the showerhead electrode and the plurality of process gas passages of the thermal control plate and the plurality of showerhead passages of the showerhead electrode cooperate to permit passage of a process gas through the electrode assembly. The respective profiles of the frontside of the thermal control plate and the backside of the showerhead electrode cooperate to define a disjointed thermal interface comprising portions proximal to the showerhead passages and portions displaced from the showerhead passages. The displaced portions of the thermal interface are recessed relative to the proximal portions of the thermal interface and are separated from the showerhead passages by the proximal portions of the thermal interface. The thermally conductive gasket is positioned along the displaced portions of the thermal interface such that the gasket is isolated from the showerhead passages.

According to another embodiment of the present invention, a plasma processing chamber is provided comprising a vacuum source, a process gas supply, a plasma power supply, a substrate support, and an upper electrode assembly fabricated to incorporate one or more of the aspects of the present invention.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

Figure 1:
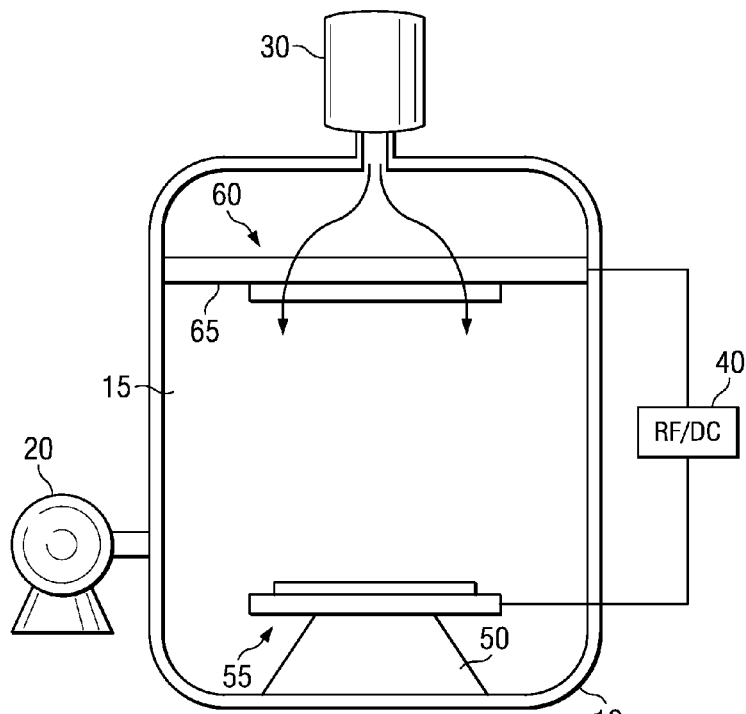
FIG. 1 is a schematic illustration of a plasma processing chamber incorporating particular aspects of some embodiments of the present invention.
Figure 2:
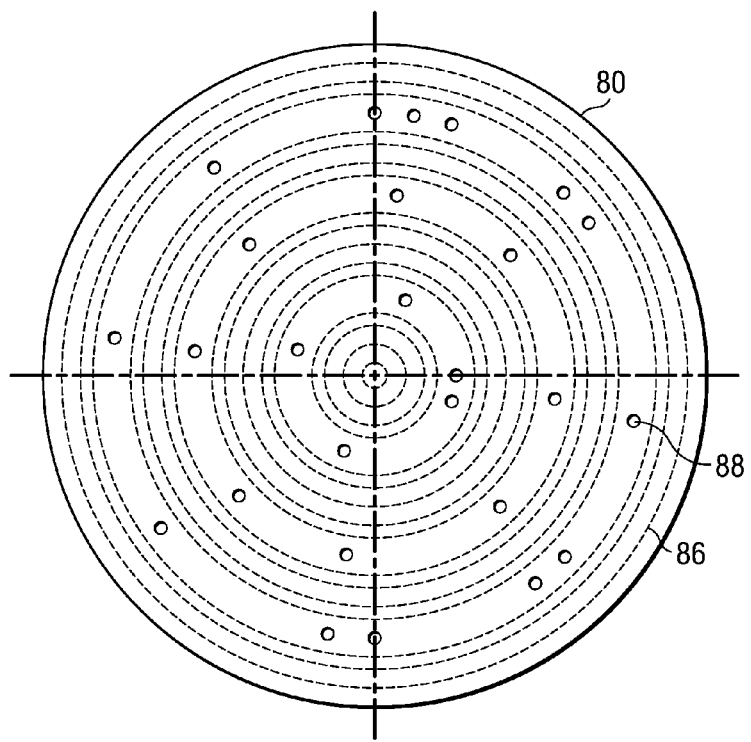
FIG. 2 is a plan view of the backside of a showerhead electrode according to one embodiment of the present invention.
Figure 3:
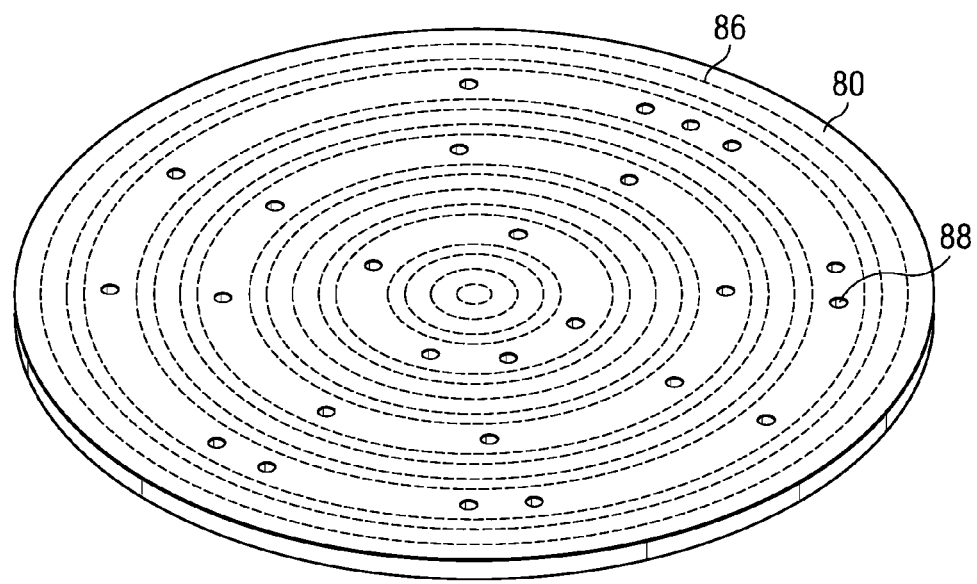
FIG. 3 is an isometric illustration of the backside and thickness dimensions of a showerhead electrode according to one embodiment of the present invention.

The embodiments set forth in the drawings are illustrative in nature and are not intended to be limiting of the invention defined by the claims. Moreover, individual aspects of the drawings and the invention will be more fully apparent and understood in view of the detailed description.

DETAILED DESCRIPTION

The various aspects of the present invention can be illustrated in the context of a plasma processing chamber 10, which is merely illustrated schematically in FIG. 1 to avoid limitation of the concepts of the present invention to particular plasma processing configurations, or components, that may not be integral to the subject matter of the present invention. As is generally illustrated in FIG. 1, the plasma processing chamber 10 comprises a vacuum source 20, a process gas supply 30, a plasma power supply 40, a substrate support 50 including a lower electrode assembly 55, and an upper electrode assembly 60.

Figure 5:
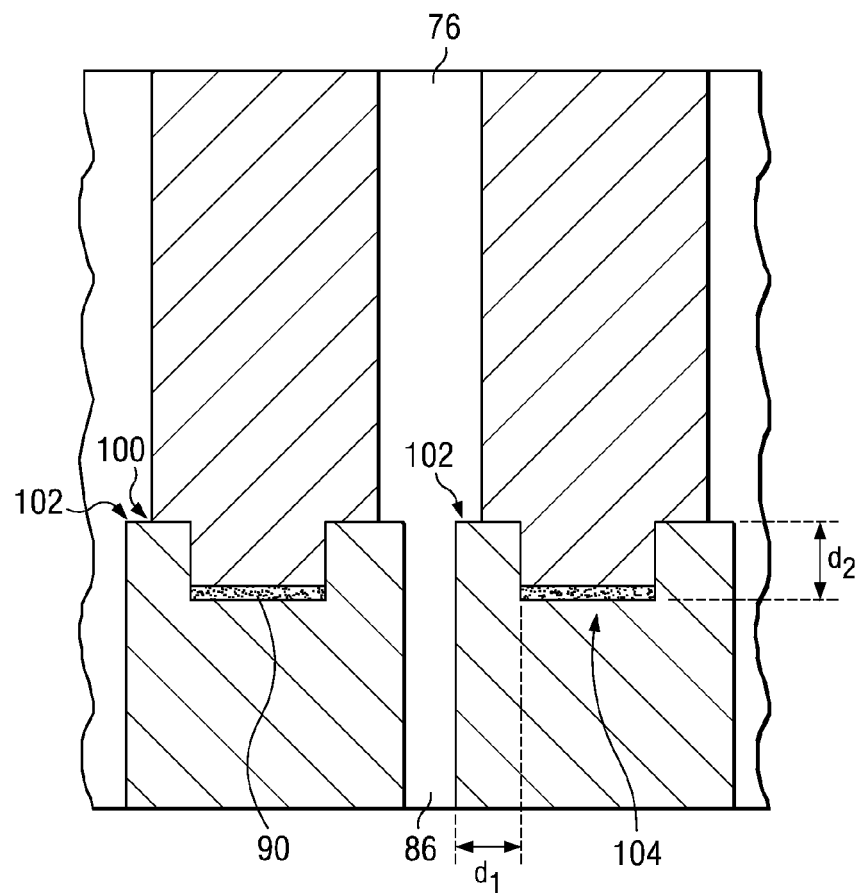
FIG. 5 is a magnified illustration of the electrode assembly shown in FIG. 4.
Figure 4:
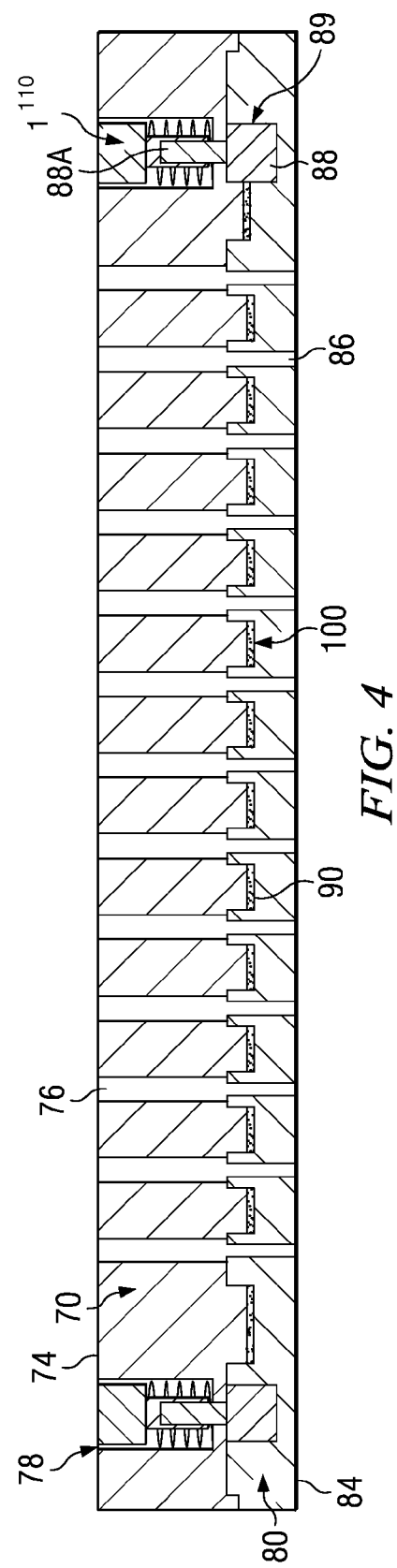
FIG. 4 is a cross sectional illustration of an electrode assembly including a disjointed thermal interface according to one embodiment of the present invention.

Referring to FIGS. 4 and 5, embodiments of upper electrode assemblies 60 of the present invention are illustrated. Generally, the electrode assembly 60 comprises a thermal control plate 70, a silicon-based showerhead electrode 80, and a thermally conductive gasket 90. The thermal control plate 70 comprises a frontside 72, a backside 74, and a plurality of process gas passages 76. These process gas passages 76 typically extend from the backside 74 through the frontside 72 of the thermal control plate 70. Although the present invention is not limited to particular thermal control plate materials or process gas passage configurations, it is noted that suitable thermal control plate materials include aluminum, aluminum alloys, or similar thermal conductors. In addition, it is noted that a variety of teachings may be relied upon in the design of thermal control plates including, but not limited to, U.S. Pub. No. 2005/0133160.

The silicon-based showerhead electrode 80, shown in FIGS. 2-5, comprises a backside 82, a frontside 84, and a plurality of showerhead passages 86. These showerhead passages 86 typically extend from the backside 82 through the frontside 84 of the showerhead electrode 80. Although the present invention is not limited to particular silicon-based showerhead electrode materials or showerhead passage configurations, it is noted that suitable showerhead electrode materials include, but are not limited to, single crystal silicon, polysilicon, silicon nitride, silicon carbide, boron carbide, aluminum nitride, aluminum oxide, or combinations thereof. In addition, it is contemplated that the silicon-based showerhead electrode 80 may be presented in a variety of configurations without departing from the scope of the present invention including, but not limited to, a single-piece, circular showerhead configurations or multi-component, circular showerhead configurations comprising a circular central electrode and one or more peripheral electrodes arranged about the circumference of the central electrode.

As shown in FIGS. 4 and 5, the thermal control plate 70 and the showerhead electrode 80 are engaged such that the frontside 72 of the thermal control plate 70 faces the backside 82 of the showerhead electrode 80. In addition, the plurality of process gas passages 76 of the thermal control plate 70 and the plurality of showerhead passages 86 of the showerhead electrode 80 cooperate to permit passage of a process gas through the electrode assembly 60.

According to one embodiment, shown in FIGS. 4 and 5, the electrode assembly 60 is configured such that the respective profiles of the frontside 72 of the thermal control plate 70 and the backside 82 of the showerhead electrode 80 cooperate to define a disjointed thermal interface 100. The disjointed thermal interface 100 comprises portions 102 proximal to the showerhead passages 86 and portions 104 displaced from the showerhead passages 86. The portions 102 proximal to the showerhead passages generally are in direct communication with the process gas that may pass through the showerhead passages 86 when the electrode assembly 60 is incorporated into a plasma processing chamber 10. The displaced portions 104 of the disjointed thermal interface 100, however, are recessed relative to the proximal portions 102 of the disjointed thermal interface 100 and are separated from the showerhead passages 86 by the proximal portions 102 of the disjointed thermal interface 100. This recess and separation of the displaced portions 104 aid in the isolation of the thermally conductive gasket 90, as described herein, to substantially prevent its contamination of the process gas and reactive species within a plasma processing chamber 10. As used herein, the term "isolated" means that the thermally conductive gasket 90 is both entirely physically separated from and at least substantially pneumatically sealed off from the showerhead passages and the process gas that may pass therethrough.

The thermally conductive gasket 90 generally is positioned along the displaced portions 104 of the disjointed thermal interface 100 such that gasket 90 is isolated from the showerhead passages 86, and, thus, also the process gas that may pass therethrough. The thermally conductive gasket 90 generally covers substantially entirely the displaced portions 104 of the disjointed thermal interface 100. It is contemplated that multiple thermally conductive gaskets 90 may be positioned along the displaced portions 104 of the disjointed thermal interface 100, however, generally, only a single gasket 90 covers substantially entirely the displaced portions 104 of the disjointed thermal interface 100. In addition, generally, the gasket 90 is not positioned along the proximal portions 102 of the disjointed thermal interface 100 so as permit greater isolation of the gasket 90 from the showerhead passages 86.

Further, the disjointed thermal interface 100 defines a degree of indirect displacement of the thermally conductive gasket 90 sufficient to isolate the gasket from the showerhead passages 86. FIG. 5 illustrates that this degree of indirect displacement of the gasket 90 may be defined by a degree of lateral displacement ($d_1$) of the gasket 90 from the showerhead passages 86 and a degree of vertical displacement ($d_2$) of the gasket 90 from a plane of the proximal portions 102 of the disjointed thermal interface 100. According to one embodiment, the degree of indirect displacement equals the sum of the degree of lateral displacement ($d_1$) and the degree of vertical displacement ($d_2$). The degree of indirect displacement may vary from on disjointed thermal interface configuration to another, so long as the degree of indirect displacement is sufficient to isolate the gasket as described herein. For example, in one embodiment, the degree of lateral displacement ($d_1$) is about 0.25 inches and the degree of vertical displacement ($d_2$) is about 0.15 inches, thus making the degree of indirect displacement of the gasket equal to about 0.40 inches.

Figure 6A:
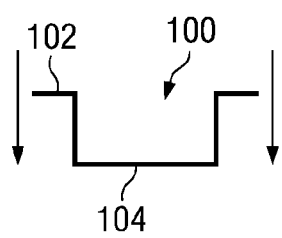
FIGS. 6A-6E are cross sectional illustrations of various disjointed thermal interface configurations according to some alternative embodiments of the present invention.
Figure 6B:
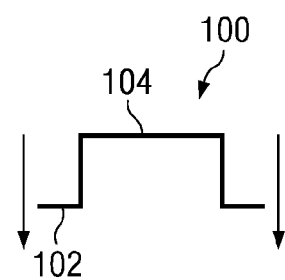
Figure 6C:
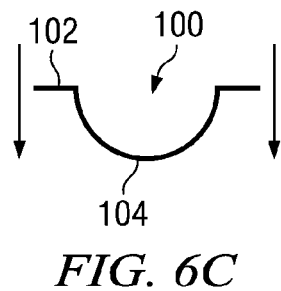
Figure 6D:
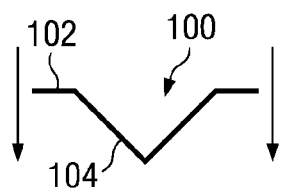
Figure 6E:
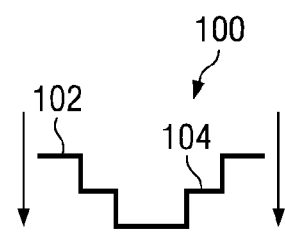

FIGS. 6A-6E illustrate a few of the numerous potential disjointed thermal interface 100 configurations that may define a degree of indirect displacement of the thermally conductive gasket 90 sufficient to isolate the gasket from the showerhead passages 86 and may be incorporated into various embodiments of the electrode assemblies of the present invention. FIG. 6A more clearly illustrates the disjointed thermal interface 100 shown in FIGS. 4 and 5. FIGS. 6C-6E show a disjointed thermal interface 100 comprising a curved profile, a v-trench profile, and a stepped profile, respectively. Meanwhile, FIG. 6B illustrates a disjointed thermal interface 100 inverted from that shown in FIG. 6A. It is contemplated that inversions of those disjointed thermal interface 100 configurations illustrated in FIGS. 6C-6E may also serve as viable disjointed thermal interface 100 configurations for purposes of the plasma processing and/or embodiments of the present invention as well. Further, it is contemplated that numerous other disjointed thermal interface 100 configurations that are not described herein or illustrated in the figures of the present application may be utilized in embodiments of the present invention so long as the disjointed thermal interface utilized defines a degree of indirect displacement of the thermally conductive gasket 90 sufficient to isolate the gasket from the showerhead passages 86.

The positioning of the thermally conductive gasket 90 along the disjointed thermal interface 100 between the frontside 72 of the thermal control plate 70 and the backside 82 of the showerhead electrode 80 facilitates in the transfer of heat across the thermal interface 100 from the showerhead electrode 80 to the thermal control plate 70 under low contact pressure conditions. Generally, during plasma processing, the temperature of the silicon-based showerhead electrode 80 increases due to ion bombardment from the plasma. To provide greater control over the temperature of the showerhead electrode 80, the thermally conductive gasket 90 facilitates heat transfer from the showerhead electrode 80 to the thermal control plate 70.

More particularly, as shown in FIGS. 4 and 5, the thermally conductive gasket 90 is in direct communication with the frontside 72 of the thermal control plate 70 and the backside 82 of the showerhead electrode 80. This direct communication of the thermally conductive gasket 90 with the frontside 72 of the thermal control plate 70 and the backside 82 of the showerhead electrode 80 promotes communication between the backside 82 of the showerhead electrode 80 and the frontside 72 of the thermal control plate 70 under low contact pressure such that the gasket 90 facilitates heat transfer across the thermal interface 100 defined by the showerhead electrode 80 and the thermal control plate 70.

To effectively transfer heat across the thermal interface 100 under low contact pressure conditions, the gasket 90 generally is configured substantially of a thermally conductive material. For example, in one embodiment, the gasket may be a composite of aluminum foil coated with a thermally and electrically conductive rubber. One example of such a composite is Q-Pad II from the Bergquist Company. Thus, it is contemplated that the thermally conductive material may also be electrically conductive. According to one embodiment, the thermally conductive gasket 90 comprises carbon nanotube fillers. It is contemplated, however, that numerous other thermally, electrically conductive gaskets may be utilized in embodiments of the present invention to effectively transfer heat across the thermal interface 100.

Referring back to FIG. 1, according to another embodiment of the present invention, a plasma processing chamber 10 comprises a vacuum source 20, a process gas supply 30, a plasma power supply 40, a substrate support 50, and an upper electrode assembly 60. The vacuum source 20 is configured to at least partially evacuate the plasma processing chamber 10. The substrate support 50, meanwhile, is positioned in an evacuated portion 15 of the plasma processing chamber 10 and comprises a substrate electrode spaced from the upper electrode assembly 60. The substrate electrode and the upper electrode assembly 60 are operatively coupled to the plasma power supply 40. The upper electrode assembly 60 utilized in the plasma processing chamber 10 may be one of any embodiment of the electrode assembly 60 apparent in the detailed description and the claims of the present application. For example, the plasma processing chamber 10 may comprise an electrode assembly that defines a disjointed thermal interface 100.

The upper electrode assembly 60 within the plasma processing chamber 10 generally defines a hermetically sealed plasma partition 65 such that gas and reactive species within the evacuated portion 15 of the plasma processing chamber 10 do not penetrate beyond the plasma partition 65 and interfere with the operation of the electrode assembly 60 and/or the plasma processing chamber 10. The particular manner in which the plasma partition 65 is defined will vary depending on the respective configurations of the thermal control plate 70 and the showerhead electrode 80. It is contemplated that, in most cases, the respective materials forming the thermal control plate 70 and the showerhead electrode 80 will define the majority of the partition 65. In addition, it is contemplated that a variety of sealing members can be used to enhance the partition 65, particularly where the thermal control plate 70 and the showerhead electrode 80 interface with each other and with other components of the plasma processing chamber 10.

Further, referring to FIG. 4, the electrode assembly 60 generally also comprises securing hardware 110. More particularly, the thermal control plate 70 may comprise securing hardware passages 78 that are configured to permit securing hardware 110 to access the backside inserts 88 positioned in the partial recesses 89 along the backside 82 of the silicon-based showerhead electrode 80. The thermal control plate 70 and the silicon-based showerhead electrode 80 can be engaged using the securing hardware 110 and the backside inserts 88. In the engaged state, the securing hardware passages 78 are aligned with the backside inserts 88 positioned in the partial recesses 89 along the backside 82 of the showerhead electrode 80. As a result, the securing hardware 110 may extend through the securing hardware passages 78 in the thermal control plate 70 and engage the backside inserts 88, which are positioned in the partial recesses 89 along the backside 82 of the showerhead electrode 80.

The securing hardware 110 and the backside inserts 88 are configured to maintain engagement of the thermal control plate 70 and the silicon-based showerhead electrode 80 and to permit repeated, nondestructive engagement and disengagement of the thermal control plate 70 and the showerhead electrode 80. According to one embodiment, shown in FIG. 4, the backside insert 88 can be configured as a stud comprising a backside extension 88A that is configured to extend into one of the securing hardware passages 78 in the thermal control plate 70. In which case, the securing hardware 110 is configured to access the backside extension 88A of the backside insert 88 in the securing hardware passage 78 via, for example, a threaded engagement. According to another embodiment, the backside inserts 88 can be configured as anchors in the partial recesses 89 formed in the backside 82 of the showerhead electrode 80. With the insert 88 in place, the securing hardware 110, which may for example comprise a threaded screw or bolt, engages the backside insert 88 to secure the showerhead electrode 80 to the thermal control plate 70.

In any of the embodiments disclosed herein employing one or more backside inserts 88, it will often be advantageous to ensure that the securing hardware 110, the backside inserts 88, and the partial recess 89 are configured such that, during thermal loading, with the securing hardware 110 and backside insert 88 in an engaged state, the backside insert 88 is able to move with the securing hardware 130 within the partial recess 89 without dislodging from the recess 89.

Accordingly, in another embodiment, the insert 88 can be secured in the recess 89 in a spring-loaded state by providing a spring, the insert 88 being configured to allow for movement of the insert 88 in the partial recess 89 in the spring-loaded state. As a result, during the thermal loading typically present in plasma processing, the backside insert 88 can move with the securing hardware 110 within the partial recess 89 without dislodging from the recess 89 and without degrading the engagement of the securing hardware 110 and the insert 88.

A variety of spring-loaded configurations can be utilized to reduce any tendency of the securing hardware 110 to become disengaged as a result of stress induced as a result of thermal loading induced during plasma processing. For example, in one configuration for providing a spring-loaded engagement of the thermal control plate 70 and the showerhead electrode 80, the backside insert 88 is configured as an anchor in one of the partial recesses 89 formed in the backside 82 of the showerhead electrode 80 and the securing hardware 110 comprises a spring element in the form of a spring-loaded washer configured to oppose a force of engagement provided when the securing hardware 110 accesses the backside insert 88. In another configuration, the backside insert 88 may be omitted in favor of direct threaded engagement with a tapped hole in the electrode material. Alternatively, the spring element can be provided as a helical spring arranged about a longitudinal extension of the securing hardware 110 in the securing hardware passage 78.

It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "generally" and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present invention or to emphasize alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the open-ended preamble term "comprising."

What is claimed is:

1. An electrode assembly comprising a thermal control plate, a silicon-based showerhead electrode, and a thermally conductive gasket, wherein:
    the thermal control plate comprises a frontside and a plurality of process gas passages;
    the showerhead electrode comprises a backside, a first showerhead passage, and a second showerhead passage;
    the thermal control plate and the showerhead electrode are engaged such that the frontside of the thermal control plate faces the backside of the showerhead electrode;
    the process gas passages of the thermal control plate, the first showerhead passage of the showerhead electrode, and the second showerhead passage of the showerhead electrode cooperate to permit passage of a process gas through the electrode assembly; and
    the respective profiles of the frontside of the thermal control plate and the backside of the showerhead electrode each cooperate to define a disjointed thermal interface, wherein:
    the frontside of the thermal control plate comprises a first frontside proximal portion that terminates at the first showerhead passage of the showerhead electrode, a second frontside proximal portion that terminates at the second showerhead passage of the showerhead electrode, and a frontside displaced portion that is offset relative to the first frontside proximal portion and the second frontside proximal portion of the frontside of the thermal control plate;
    the frontside displaced portion of the frontside of the thermal control plate is separated from the first showerhead passage of the showerhead electrode by the first frontside proximal portion of the frontside of the thermal control plate;
    the backside of the showerhead electrode comprises a first backside proximal portion that terminates at the first showerhead passage of the showerhead electrode, a second backside proximal portion that terminates at the second showerhead passage of the showerhead electrode, and a backside displaced portion that is offset relative to the first backside proximal portion and the second backside proximal portion of the backside of the showerhead electrode;
    the backside displaced portion of the backside of the showerhead electrode is separated from the first showerhead passage of the showerhead electrode by the first backside proximal portion of the backside of the showerhead electrode; and
    the thermally conductive gasket is positioned along the frontside displaced portion of the frontside of the thermal control plate and the backside displaced portion of the backside of the showerhead electrode such that the thermally conductive gasket is isolated from the first showerhead passage of the showerhead electrode.

2. The electrode assembly of claim 1, wherein the thermally conductive gasket covers substantially entirely the backside displaced portion of the backside of the showerhead electrode.

3. The electrode assembly of claim 1, wherein the thermally conductive gasket is not positioned along the first frontside proximal portion and the second frontside proximal portion of the frontside of the thermal control plate.

4. The electrode assembly of claim 1, wherein the disjointed thermal interface defines a degree of indirect displacement of the thermally conductive gasket sufficient to isolate the gasket from the showerhead passages.

5. The electrode assembly of claim 4, wherein the degree of indirect displacement of the thermally conductive gasket is defined by a degree of lateral displacement ($d_1$) of the gasket from the showerhead passage and a degree of vertical displacement ($d_2$) of the gasket from a plane of the first frontside proximal portion of the frontside of the thermal control plate.

6. The electrode assembly of claim 1, wherein the thermally conductive gasket is in direct communication with the frontside of the thermal control plate and the backside of the showerhead electrode.

7. The electrode assembly of claim 6, wherein the direct communication of the thermally conductive gasket with the frontside of the thermal control plate and the backside of the showerhead electrode promotes communication between the backside of the showerhead electrode and the frontside of the thermal control plate such that the gasket facilitates heat transfer across the disjointed thermal interface defined by the showerhead electrode and the thermal control plate.

8. The electrode assembly of claim 1, wherein the thermally conductive gasket comprises carbon nanotube fillers.

9. The electrode assembly of claim 1, wherein the first backside proximal portion and the second backside proximal portion of the backside of the showerhead electrode are in direct communication with the process gas that may pass through the electrode assembly.

10. An electrode assembly comprising a thermal control plate, a silicon-based showerhead electrode, and a thermally conductive gasket, wherein:
    the thermal control plate comprises a frontside, a backside, and a plurality of process gas passages;
    the showerhead electrode comprises a frontside, a backside, and a plurality of showerhead passages;
    the thermal control plate and the showerhead electrode are engaged such that the frontside of the thermal control plate faces the backside of the showerhead electrode;
    the plurality of process gas passages of the thermal control plate and the plurality of showerhead passages of the showerhead electrode cooperate to permit passage of a process gas through the electrode assembly;
    the respective profiles of the frontside of the thermal control plate and the backside of the showerhead electrode cooperate to define a disjointed thermal interface comprising portions proximal to the showerhead passages and portions displaced from the showerhead passages;
    the displaced portions of the disjointed thermal interface are recessed relative to the proximal portions of the disjointed thermal interface and are separated from the showerhead passages by the proximal portions of the disjointed thermal interface;
    the thermally conductive gasket covers substantially entirely the displaced portions of the disjointed thermal interface;
    the disjointed thermal interface defines a degree of indirect displacement of the thermally conductive gasket sufficient to isolate the gasket from the showerhead passages; and
    the thermally conductive gasket comprises a composite of aluminum foil coated with a thermally and electrically conductive rubber.

11. The electrode assembly of claim 10, wherein the degree of indirect displacement of the thermally conductive gasket is defined by a degree of lateral displacement ($d_1$) of the gasket from the showerhead passage and a degree of vertical displacement ($d_2$) of the gasket from a plane of the proximal portions of the disjointed thermal interface.

12. The electrode assembly of claim 10, wherein the thermally conductive gasket is not positioned along the proximal portions of the disjointed thermal interface.

13. The electrode assembly of claim 10, wherein the thermally conductive gasket is in direct communication with the frontside of the thermal control plate and the backside of the showerhead electrode.

14. The electrode assembly of claim 13, wherein the direct communication of the thermally conductive gasket with the frontside of the thermal control plate and the backside of the showerhead electrode promotes communication between the backside of the showerhead electrode and the frontside of the thermal control plate such that the gasket facilitates heat transfer across the disjointed thermal interface defined by the showerhead electrode and the thermal control plate.

15. A plasma processing chamber comprising a vacuum source, a process gas supply, a plasma power supply, a substrate support, and an upper electrode assembly, wherein:
   the vacuum source is configured to at least partially evacuate the plasma processing chamber;
   the substrate support is positioned in an evacuated portion of the plasma processing chamber and comprises a substrate electrode spaced from the upper electrode assembly;
   the substrate electrode and the upper electrode assembly are operatively coupled to the plasma power supply;
   the upper electrode assembly comprises a thermal control plate, a silicon-based showerhead electrode, and a thermally conductive gasket;
   the thermal control plate comprises a frontside, a backside, and a plurality of process gas passages;
   the showerhead electrode comprises a frontside, a backside, and a plurality of showerhead passages;
   the thermal control plate and the showerhead electrode are engaged such that the frontside of the thermal control plate faces the backside of the showerhead electrode;
   the plurality of process gas passages of the thermal control plate and the plurality of showerhead passages of the showerhead electrode cooperate to permit passage of a process gas through the electrode assembly;
   the respective profiles of the frontside of the thermal control plate and the backside of the showerhead electrode cooperate to define a disjointed thermal interface comprising portions proximal to the showerhead passages and portions displaced from the showerhead passages;
   the displaced portions of the disjointed thermal interface are recessed relative to the proximal portions of the disjointed thermal interface and are separated from the showerhead passages by the proximal portions of the disjointed thermal interface;
   the thermally conductive gasket is positioned along the displaced portions of the disjointed thermal interface such that the gasket is isolated from the showerhead passages; and
   the thermally conductive gasket comprises a composite of aluminum foil coated with a thermally and electrically conductive rubber.

16. The plasma processing chamber of claim 15, wherein the thermally conductive gasket covers substantially entirely the displaced portions of the disjointed thermal interface.

17. The plasma processing chamber of claim 15, wherein the thermally conductive gasket is not positioned along the proximal portions of the disjointed thermal interface.

18. The plasma processing chamber of claim 15, wherein the disjointed thermal interface defines a degree of indirect displacement of the thermally conductive gasket sufficient to isolate the gasket from the showerhead passages.

19. The plasma processing chamber of claim 18, wherein the degree of indirect displacement of the thermally conductive gasket is defined by a degree of lateral displacement ($d_1$) of the gasket from the showerhead passage and a degree of vertical displacement ($d_2$) of the gasket from a plane of the proximal portions of the disjointed thermal interface.

20. The plasma processing chamber of claim 15, wherein the thermally conductive gasket is in direct communication with the frontside of the thermal control plate and the backside of the showerhead electrode.

21. The plasma processing chamber of claim 15, wherein the proximal portions of the disjointed thermal interface are in direct communication with the process gas that may pass through the showerhead passages of the showerhead electrode.

* * * * *